United States Patent
Lin

(10) Patent No.: US 7,701,292 B2
(45) Date of Patent: Apr. 20, 2010

(54) PROGRAMMABLE GAIN AMPLIFIER WITH NOISE CANCELLATION

(75) Inventor: Chia-Liang Lin, Union City, CA (US)

(73) Assignee: Realtek Semiconductor Corp. (TW)

( * ) Notice: Subject to any disclaimer, the term of this patent is extended or adjusted under 35 U.S.C. 154(b) by 53 days.

(21) Appl. No.: 11/972,569

(22) Filed: Jan. 10, 2008

(65) Prior Publication Data

US 2008/0224779 A1    Sep. 18, 2008

Related U.S. Application Data

(60) Provisional application No. 60/894,461, filed on Mar. 13, 2007.

(51) Int. Cl.
*H03G 3/12*    (2006.01)
(52) U.S. Cl. ............... 330/284; 330/282; 330/295
(58) Field of Classification Search ............ 330/124 R, 330/278, 282, 284
See application file for complete search history.

(56) References Cited

U.S. PATENT DOCUMENTS 5,015,965 A * 5/1991 Katz et al. ............... 330/295
6,211,734 B1 * 4/2001 Ahn ....................... 330/124 R
7,221,221 B2 * 5/2007 Bouny ...................... 330/302

OTHER PUBLICATIONS

Bruccoleri, F., et al., "Wide-Band CMOS Low-Noise Amplifier Exploiting Thermal Noise Canceling", *IEEE Journal of Solid-State Circuits*, 39, (Feb. 2004), 275-282.
Gupta, M., et al., "A 48-to-860MHz CMOS Direct-Conversion TV Tuner", *Proceedings of the IEEE International Solid-State Circuits Conference (ISSCC 2007)*, Digest of Technical Papers, (2007), 206-207.

* cited by examiner

*Primary Examiner*—Khanh V Nguyen
(74) *Attorney, Agent, or Firm*—Schwegman, Lundberg & Woessner, P.A.

(57) ABSTRACT

A wide-band adjustable gain low-noise amplifier (LNA) is disclosed. In various embodiments, the LNA includes a first inverting amplifier configured to generate a first intermediate signal. A first attenuator is configured to receive the first intermediate signal and to generate a second intermediate signal. In various embodiments, the LNA includes a second attenuator configured to generate a third intermediate signal. A second inverting amplifier is configured to generate a fourth intermediate signal using the third intermediate signal. A summing circuit is configured to generate an output signal based on the second and the fourth intermediate signals. Apparatus and methods according to various embodiments of the invention are also disclosed.

20 Claims, 3 Drawing Sheets

PROGRAMMABLE GAIN AMPLIFIER WITH NOISE CANCELLATION

RELATED APPLICATION

This application claims the benefit of U.S. Provisional Application Ser. No. 60/894,461 filed Mar. 13, 2007, titled "Programmable Gain Noise-Cancelling Low-Noise Amplifier", which application is incorporated herein by reference

TECHNICAL FIELD

The various embodiments described herein relate generally to amplification circuits, including programmable gain amplifiers with noise cancellation.

BACKGROUND

Wireless systems enable a mobile user to communicate with others through the broadcast of electromagnetic radiation. Wireless terminals generally include receiver circuitry for capturing broadcast signals. Many receivers include amplification circuitry at the front-end to amplify received signals before down converting for further processing. Such amplification circuitry will amplify noise mixed in with the received radio frequency (RF) signal and can generate its own noise as well. The generation of noise can reduce the quality of the received signal, and consequently, reduce the distance of signal propagation over which information in the signal may be detected. Conversely, reducing the receiver's noise figure (NF) can increase the ability to detect wireless broadcast signals. Thus, reducing the NF of a receiver may enable detection of information in signals transmitted at increasing greater distances from the receiver.

RF amplification circuits are generally designed to process signals within a specified frequency range. A conventional television broadcast systems, which is an example of a wideband system operating from about 50 MHz to about 860 MHz, requires a receiver having a certain minimum amplifier gain, return loss and NF in order to efficiently convert a broadcast signal for viewing. Amplifier gain quantifies the magnitude of the amplification provided by an amplifier. Return loss quantifies the degree to which the amplifier's input impedance matches the impedance of a preceding circuit (i.e., a source impedance). The NF quantifies the amount of additive noise introduced by the amplifier. An increasingly higher gain indicates the amplifier provides increasingly larger signal amplification, an increasingly higher return loss indicates the input impedance of the amplifier is increasingly better matched to the source impedance. A decreasing or lower NF indicates the amplifier introduces an increasingly lower level of noise.

The dynamic gain range of an amplifier is another parameter that can affect receiver performance. Since atmospheric conditions and distances between a transmission station and a receiver can vary, so can signal strength. A receiver must generally be able to process RF signals over wide dynamic gain range to accommodate variations in signal strengths. A useful RF signal may range from a low of about −90 dBm to a high of about −25 dBm at the receiver. Such a wide range can be accommodated by adjusting receiver gain, for example, by setting a lower gain when the received signal strength is greater and setting a higher gain when the received signal strength is weaker. If the received signal is strong, the noise introduced by an amplifier is less significant and a larger NF can often be tolerated. If, however, the received signal is weak, the noise introduced by an amplifier can be significant, and therefore, a high NF is no longer acceptable. In addition to gain and NF parameters, matching the receiver's input impedance to the signal's source impedance is also an important consideration. A higher return loss generally means the receiver's impendence matches better with the signal's source impedance and thus more useful signal is available for processing. What is needed then is a wide-band frequency amplifier with a widely adjustable gain that allows for good impedance matching to a source circuit, and has a low NF.

BRIEF SUMMARY OF THE EMBODIMENTS

Good reception of weak RF signals usually requires use of a high gain amplifier to boost signal amplitude. For many RF applications though, the NF of an amplifier is important when the amplifier's gain is sufficiently high. Moreover, good reception of strong signals may not require high gain, and in fact, use of a high gain may introduce output signal distortion. One way to optimize signal reception, without substantially compromising NF or substantially distorting the amplified signal, is to adjust amplifier gain according to the received signal strength. For these and other applications, an amplifier having a programmable gain and configured to cancel intrinsic amplifier noise can be used to form a low noise amplifier (LNA).

In an embodiment, a low noise amplifier (LNA) includes a feedback resistance and a first amplifier. The first amplifier is coupled to an input node and configured to generate a first intermediate signal across the feedback resistance. The LNA includes a first attenuator configured to receive the first intermediate signal and to generate a second intermediate signal. The LNA also includes a second attenuator coupled to the input node and configured to generate a third intermediate signal. The LNA further includes a second amplifier configured to receive the third intermediate signal and to generate a fourth intermediate signal. The LNA also include a summing circuit configured to generate an output signal using the second intermediate signal and the fourth intermediate signal. In embodiments, one or more of the first amplifier or the second amplifier are inverting amplifiers.

In an embodiment, a method includes amplifying an input signal by a first gain factor to generate a first intermediate signal. The method also includes forming a feedback path between the first intermediate signal and the input signal. The method also includes attenuating the first intermediate signal by a first attenuation factor to generate a second intermediate signal. The method also includes attenuating the input signal by a second attenuation factor to generate a third intermediate signal. The method also includes amplifying the third intermediate signal by a second gain factor to generate a fourth intermediate signal, and summing the second intermediate signal and the fourth intermediate signal at an output node.

DETAILED DESCRIPTION

The following detailed description refers to the accompanying drawings that show, by way of illustration, specific details and embodiments in which the invention may be practiced. These embodiments, which are also referred to herein as "examples," are described in sufficient detail to enable those skilled in the art to practice the invention.

In various embodiments, an amplifier structure includes metal oxide field effect transistors (MOSFETs), such as a p-channel (PMOS) or an n-channel (NMOS) transistor, bipolar junction transistors (BJTs), heterojunction bipolar transistors (HBTs), and high electron mobility transistors (HEMTs).

For many RF applications, the NF of an amplifier can be important if a sufficiently high gain is used to process a signal. A noise canceling shunt-feedback amplifier can be designed with a low NF and an input impedance closely matching a source circuit with a narrow range of gain. However, it can be difficult to obtain a wide variable gain range without significantly degrading the impedance match between the source circuit and the shunt-feedback amplifier. Since it can be important to maintain good impedance matching under gain adjustment, the adjustable gain range possible with the noise-cancelling shunt-feedback amplifier is highly limited. It will be appreciated that the above noted problems and applications can be addressed with an amplifier that allows for good impedance matching, has a wide gain range, and a low NF.

Figure 1:
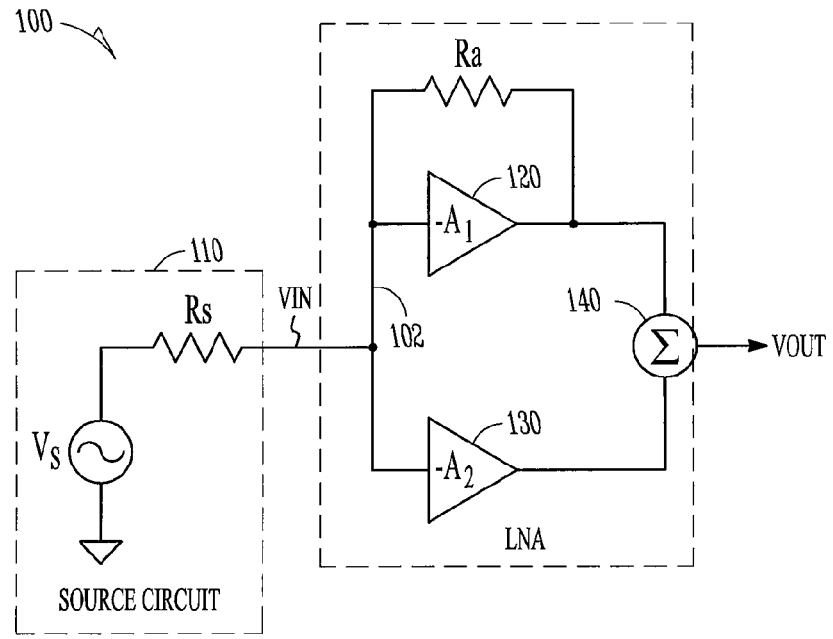
FIG. 1 illustrates a shunt-series amplifier.

FIG. 1 illustrates low noise amplifier (LNA) 100 in shunt-feedback amplifier topology connected to source circuit 110. LNA 100 includes inverting amplifier 120, inverting amplifier 130, and summing circuit 140. Source circuit 110 includes a source impedance RS and a voltage source VS that generates an input voltage VIN at input node 102. A shunt-feedback resistor $R_a$ is connected between input node 102 and the output node of amplifier 120. Inverting amplifier 120 receives input voltage VIN as does inverting amplifier 130. The corresponding gain of amplifiers 120 and 130 are $-A_1$ and $-A_2$, respectively. The output of first inverting amplifier 120 and the output of the second inverting amplifier 130 each provide 180° phase shifted signals to summing circuit 140 that are proportional to VIN. Both amplifier 120 and amplifier 130 have very high impedances relative to RS in the frequency band of interest, and therefore, essentially all current flowing from the source circuit to LNA 100 flows through $R_a$. Since substantially no current flows through either amplifier, the input impedance of LNA 100 can be approximated by the expression $$R\text{in}=R_a/(1+A_1). \quad (1)$$

Thus, the input impedance of LNA 100 can be readily matched to RS by proper selection of $R_a$ and $A_1$.

Noise introduced by amplifier 120 at its output is directly transmitted to summing circuit 140. In the mean while, the same noise fed back to the input node 102 via feedback resistor $R_a$ and subsequently amplified by amplifier 130 and transmitted to summing circuit 140. Consequently, the noise generated by amplifier 120 can be canceled at the output of summing circuit 140 provided $$1-RS/(RS+R_a) \cdot A_2=0, \text{ or equivalently}$$

$$RS/(RS+R_a) \cdot A_2=1. \quad (2)$$

Here, the factor $RS/(RS+R_a)$ accounts for the coupling of the noise from the output of amplifier 120 to the input node 102, and the factor $-A_2$ accounts for the amplification factor via amplifier 130. That is, if the noise signal indirectly transmitted to summing circuit 140 via feedback resistor $R_a$ and subsequently amplifier 130 has the same amplitude as the noise signal directly transmitted to summing circuit 140 but of an opposite polarity, then the noise signal can be made to cancel at the output of summing circuit 149. As a result, a low NF can be achieved. However, it is very difficult to achieve a widely variable range of gain without substantially degrading the impedance match between LNA 100 and source circuit 110 because RS generally has a fixed value. Consequently, adjusting the signal gain of LNA 100 generally means adjusting $R_a$, which also requires adjusting $-A_1$ to maintain an impedance match. Further adjustment of $-A_2$ in relation to RS is required to eliminate noise introduced by amplifier 120. Since it is generally necessary to maintain a good impedance match between a LNA and source circuit under gain adjustment, the range of gain adjustment possible with the noise-canceling shunt-feedback amplifier, such as LNA 100, is limited. What is needed then is a programmable gain noise-cancelling amplifier that allows for good impedance matching to a source circuit over a wide gain range, and has a low NF over the frequency range of interest.

Figure 2:
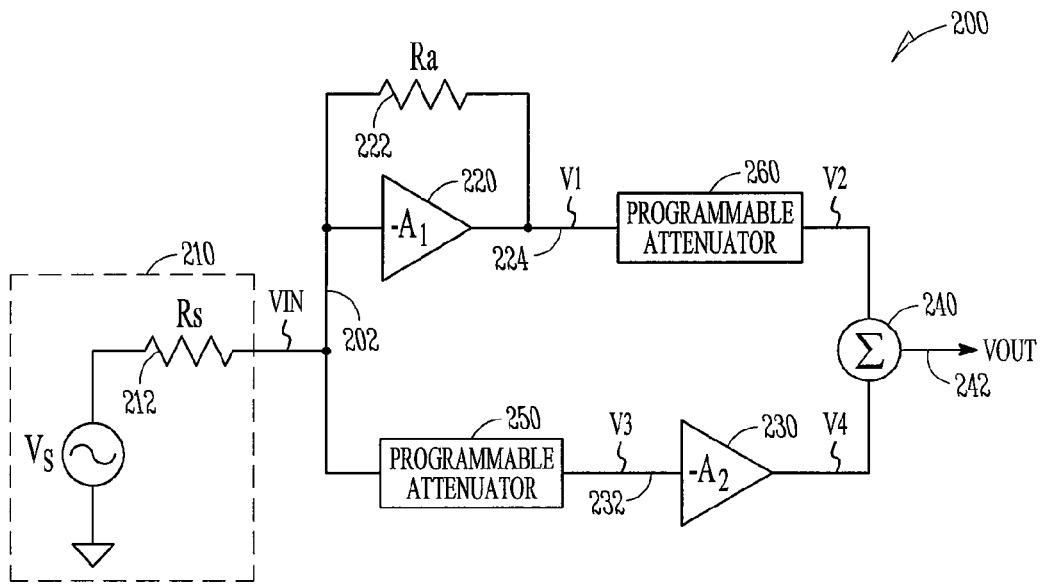
FIG. 2 illustrates an amplifier circuit according to various embodiments of the invention.

FIG. 2 illustrates an amplifier according to various embodiments of the invention. In this example, a programmable gain LNA 200 is configured to reduce internally generated noise. LNA 200 includes a first inverting amplifier 220 and a programmable attenuator 250 coupled to a preceding circuit 210 at input node 202. A second inverting amplifier 230 is coupled to the output of the programmable attenuator 250 at node 232. Each of the inverting amplifiers 220 and 230 are configured with a negative gain factor, $-A_1$ and $-A_2$, respectively. A shunt-feedback resistor (Ra) 222 is connected between input node 202 and output of the first inverting amplifier 220 at node 224 to provide a negative feedback path. First inverting amplifier 220 is further connected to another programmable attenuator 260 at node 224 to provide a first intermediate signal V1 for further processing. The input impedance of first inverting amplifier 220 and the first programmable attenuator 250 can be made very high relative to Rs 212 such that essentially all current flowing from the preceding circuit 210 to LNA 200 flows through Ra 222.

The first intermediate signal V1 is then coupled to programmable attenuator 260 to generate a second intermediate signal V2. Second intermediate signal V2 is the intermediate signal V1 reduced in magnitude by a programmed attenuation factor $\alpha_1$, i.e. $V2=\alpha_1 V1$.

The signal at input node 202 is also received by programmable attenuator 250. The output of programmable attenuator 250 is a third intermediate signal V3 that is related to the signal at input node 202 by a programmed attenuation factor $\alpha_2$, i.e. $V3=\alpha_2 VIN$. The third intermediate signal V3 is coupled to the input of the second inverting amplifier 230. The output of the second inverting amplifier 230 is an intermediate signal V4 corresponding to the intermediate signal V3 multiplied by a second negative gain factor, $-A_2$, i.e. $V4=-A_2 V3$.

The output of programmable attenuator 260 and second inverting amplifier 230 provide intermediate signals, V2 and V4, respectively, to a summing circuit 240. The output of summing circuit 240 is the sum of the intermediate signals V2 and V4. The noise at the output of amplifier 220 is directly coupled to summing circuit 240 through programmable attenuator 260 and becomes a component of intermediate voltage V2. On the other hand, the noise at the output of amplifier 220 is fed back through Ra 222, then attenuated through programmable attenuator 250, then amplified by amplifier 230, and thus becomes a component in intermediate signal V4. The noise directly coupled from the output of amplifier 220 to summing circuit 240 through programmable attenuator 260 can be cancelled by the noise indirectly coupled from the output of amplifier 220 to summing circuit 240 through resistor Ra, programmable attenuator 250, and amplifier 230 provided $\alpha_1$ and $\alpha_2$ are adjusted according to the following expression $$\alpha_1 = Rs/(Rs+Ra) \cdot \alpha_2 \cdot A_2. \quad (3)$$

Here, the left hand side of (3) accounts for the factor for the direct coupling from the output of amplifier 220 to summing circuit 240 through programmable attenuator 260, while the right hand side of (3) accounts for the factor for the indirect coupling from the output of amplifier 220 to summing circuit 240 through resistor Ra, programmable attenuator 250, and amplifier 230. In the mean while, the input impedance of LNA 200 can be matched to Rs 212 by adjusting Ra and $A_1$ such that $Rs=Ra/(1+A_1)$. By adjusting $\alpha_1$, $\alpha_2$, and/or $A_2$, the noise cancellation condition (3) can be met without adjusting the values of Ra or $A_1$, and therefore the input impedance of LNA 200 can be match to Rs 212 over a wide range of gain.

While the FIG. 2 example shows negative gain at each of the amplifiers 120 and 130, it is within the scope of the present invention to use positive gains at either of both of these amplifiers. The signals supplied to the summing circuit can be selectively inverted to achieve the noise reduction as described herein. The summing circuit 140 itself can subtract or invert either or both signal V2 or V4.

Figure 3:
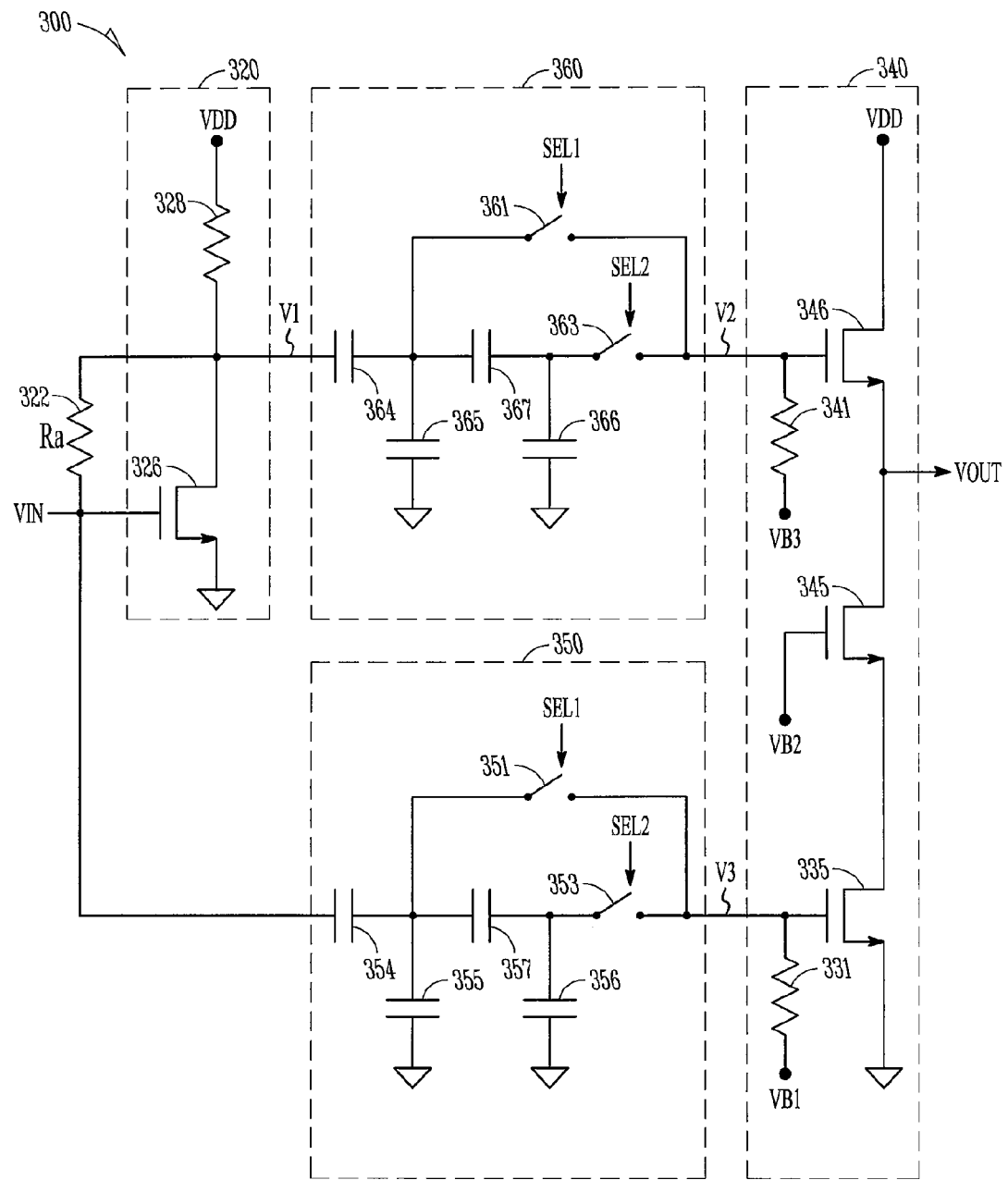
FIG. 3 illustrates an amplifier circuit according to various embodiments of the invention.

FIG. 3 illustrates an amplifier circuit according to various embodiments of the invention. LNA 300 is an example of a circuit for implementing LNA 200. LNA 300 includes a first inverting amplifier 320, a first programmable attenuator 360, a second programmable attenuator 350, and a summing circuit 340. Summing circuit 340 is coupled to the output of second programmable attenuator 350 and to the output of first programmable attenuator 360. First inverting amplifier 320 can be an inverting amplifier with a gain $-A_1$, such as amplifier 220, as described above and illustrated in FIG. 2. Programmable attenuators 350 and 360 have attenuation factors $\alpha_2$ and $\alpha_1$, respectively, as described above and illustrated in FIG. 2. Summing circuit 340 includes an inverting amplifier, for example, embodied by NMOS transistor 335 configured to provide a gain $-A_2$, such as the second inverting amplifier 230, as described above and illustrated in FIG. 2.

Inverting amplifier 320 is arranged in a common source topology with transistor 326 connected to drain resistor 328 and feedback resistor Ra 322. The input of first programmable attenuator 360 is coupled to the output of first inverting amplifier 320 to receive intermediate signal V1. First programmable attenuator 360 includes a network of four capacitors 364-367 arranged to provide a first attenuation factor, $\alpha_1$, programmable according to the state of signals SEL1 and SEL2 asserted at switches 361 and 363, respectively. Signals SEL1 and SEL2 have opposite states such that when SEL1 is asserted switch 361 is closed, SEL2 is de-asserted and switch 363 is open, and visa versa. The resultant second intermediate signal V2, which is related to V1 by the first attenuation factor $\alpha_1$, is provided to summing circuit 340 for further processing.

Second programmable attenuator 350 includes a similar capacitor ladder of four capacitors 354-357 arranged to provide a second attenuation factor, $\alpha_2$, programmable according to the state of signals SEL 1 and SEL 2 asserted at switches 351 and 353, respectively. The operation of second programmable attenuator 350 is similar to that described above for the first programmable attenuator 360. The input of the second programmable attenuator 350 is coupled to receive VIN that is provided to the first inverting amplifier 320. The resultant third intermediate signal V3, which is related to VIN by the second attenuation factor $\alpha_2$, is provided to summing circuit 340 for further processing.

Summing circuit 340 is also coupled to receive intermediate voltage V2 from the first programmable attenuator 360. Summing circuit 340 includes transistor 346 arranged in a common-drain topology, cascode transistor 345, and NMOS transistor 335 arranged in a common-source topology. Voltage VB2 provides a gate bias to transistor 345, VB3 provides a gate bias to transistor 346 across bias resistor 341, and VB1 provides a gate bias to NMOS transistor 335 across bias resistor 331. Transistor 346 is configured to provide non-inverting amplification of intermediate voltage V2 with a gain of slightly less than one. The output of transistor 335 is summed with output of transistor 346 using cascode transistor 345.

Noise generated by first inverting amplifier 320 is transmitted to the first programmable attenuator 360 within the first intermediate signal V1. A portion of this noise is also transmitted back through Ra 322 to second programmable attenuator 350. Consequently, the third intermediate signal V3 includes a fraction of the noise generated by amplifier 320, further reduced by attenuation factor $\alpha_2$, as determined by the state of SEL1 and SEL2. The noise contained in V3 is transmitted by NMOS transistor 335 to transistor 345 along with an associated gain.

The noise contained in first intermediate signal V1 is further transmitted within intermediate V2, reduced by the first attenuation factor $\alpha_1$, as determined by SEL1 and SEL2. The signal provided by common drain transistor 346 likewise includes the noise contained in intermediate signal V2. The noise in intermediate signal V2 and the noise in intermediate signal output from NMOS transistor 335 are of opposite phase. Accordingly, if the values for Ra, Rs, $A_2$, $\alpha_1$, and $\alpha_2$ are chosen such that EQUATION (3) is satisfied, then the corresponding signal (VOUT) of summing circuit 340 will be substantially free of a noise component contributed by amplifier 320.

The input impedance for LNA 300 can be made approximately equal to $Ra/(1+A_1)$. Therefore, the input impedance of LNA 300 can be matched to Rs by proper selection of Ra and $A_1$. Since noise cancellation for LNA 300 depends on $A_2$ and the values of the capacitors in the programmable attenuators 350 and 360, the input impedance of LNA 300 can be matched without a loss of the ability to cancel amplifier noise and reduce NF.

The above LNA design is flexible. The amplifier topology is not limited to single-ended topologies. For example, fully-differential and/or pseudo-differential topologies can be used to form LNA 200 and LNA 300. Current biasing can also be substituted for voltage biasing, as is known to one of ordinary skill in the art. Alternative amplifier topologies can be used for inverting amplifier 320. Alternative amplifier topologies can also be used for the inverting amplification embedded in summing circuit 340. Alternative programmable attenuator circuits, e.g. a programmable resistor ladder, can be used.

Figure 4:
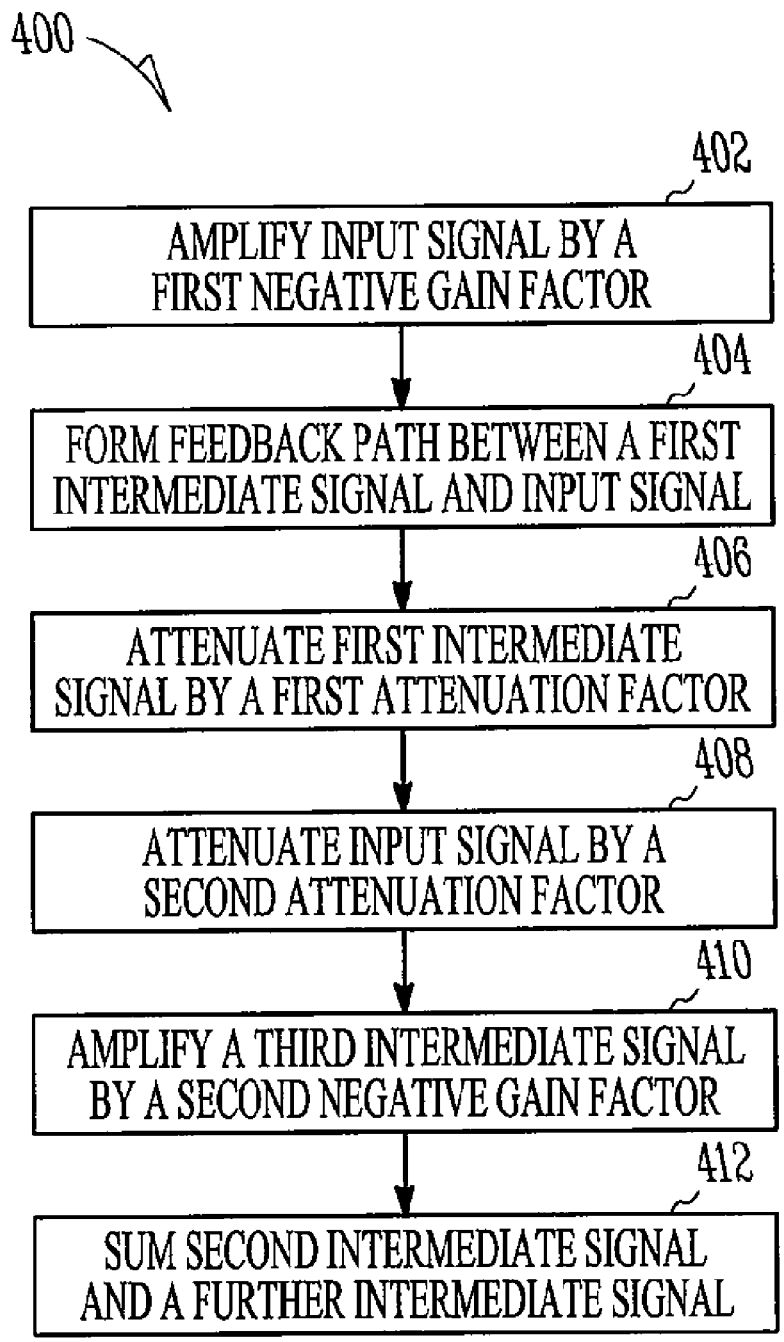
FIG. 4 illustrates a method according to various embodiments of the invention.

FIG. 4 illustrates a method according to various embodiments of the invention. Method 400 begins at block 402 where an input signal is amplified by a first negative gain factor using a first amplifier. The signal product generated is a first intermediate signal that is transmitted to a first programmable attenuator.

The method continues at block 404 where a feedback path is provided between the first intermediate signal and the input signal. The feedback path can be formed by coupling a resistance between the input and an output of the first amplifier. The resistance can be adjusted to match an impedance of a preceding circuit. The negative gain factor can also be adjusted to provide a desired gain and to match the impedance of a preceding circuit.

At block 406 the first intermediate signal is attenuated by a first attenuation factor associated with the first programmable attenuator. The first attenuation factor can be adjusted by the assertion of logical signals to switches incorporated in a capacitive ladder, as illustrated in FIG. 3. Alternatively, a resistor ladder can be used to implement a programmable attenuator, as well known by those of ordinary skills in the art. Consequently, a second intermediate signal is generated at the output of the first programmable attenuator, as determined by the logical signals. The first intermediate signal is transmitted to a summing circuit for further processing.

At block 408 the input signal is attenuated by a second attenuation factor using a second programmable attenuator. The second attenuation factor can be generated by assertion of logical signals to switches incorporated in a capacitive ladder, as also illustrated in FIG. 3. Alternatively, a resistor ladder can be used to implement a programmable attenuator, as well known by those of ordinary skills in the art. Consequently, the second programmable attenuator generates a third intermediate signal at an output node, as determined by the logical signals. The third intermediate signal is transmitted to a second amplifier for further processing.

The method continues at block 410 with the third intermediate signal being amplified by a second amplifier having a second negative gain factor. The second amplifier generates a fourth intermediate signal as a product of the third intermediate signal and the second negative gain factor. The second amplifier transmits the fourth intermediate signal to the summing circuit for further processing.

At block 412 the second intermediate signal and the fourth intermediate signal are summed together using a summing circuit. The resultant signal output from the summing circuit is an amplified representation of the input signal that is substantially free of noise associated with the first inverting amplifier.

The above method further allows the input signal to be continuously monitored enabling real time adjustment of signal gain and input impedance to maintain optimum receiver performance.

The above description of a receiver is not exclusive or exhaustive, but is intended to illustrate one possible arrangement of a receiver in a manner so to not obscure the invention. Accordingly, it will be recognized by one of ordinary skill in the art that further arrangements are possible For some applications a receiver must operate over a wide band or range of frequencies ("wide-band"). An amplifier that can operate over a wide-band with a low noise figure can improve the quality of a received signal. This is particularly true for free-space transmission systems because atmospheric weather conditions are dynamic, and because transmission distances for the mobile user can continuously change. It will be appreciated that the above noted problems and applications can be addressed with amplifiers having a low noise figure and improved dynamic response over a wide range of frequencies.

The above Detailed Description is intended to be illustrative, and not restrictive. The various embodiments are not necessarily mutually exclusive, as some embodiments can be combined with one or more other embodiments to form new embodiments. For example, the above-described embodiments (and/or aspects thereof) embodiments may be combined, utilized and derived therefrom, such that structural and logical substitutions and changes may be made without departing from the scope of this disclosure. Such embodiments of the inventive subject matter may be referred to herein, individually and/or collectively, by the term "invention" merely for convenience and without intending to voluntarily limit the scope of this application to any single invention or inventive concept if more than one is in fact disclosed. Many other embodiments will be apparent to those of skill in the art upon reviewing the above description. The scope of the invention should, therefore, be determined with reference to the appended claims, along with the full scope of equivalents to which such claims are entitled.

The methods described herein do not have to be executed in the order described, or in any particular order, unless it is otherwise specified that a particular order is required. Moreover, unless otherwise specified, various activities described with respect to the methods identified herein can be executed in repetitive, simultaneous, serial, or parallel fashion.

The terms "a" or "an" are used, as is common in patent documents, to include one or more than one. The term "or" is used to refer to a nonexclusive or, unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. §1.72(b), requiring the abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A circuit comprising:
    a first amplifier with a first gain factor, the first amplifier coupled to an input node and configured to generate a first intermediate signal;
    a feedback resistor to provide a feedback path for the first intermediate signal to be fed back to the input node;
    a first attenuator with a first attenuation factor, the first attenuator configured to receive the first intermediate signal and to generate second intermediate signal;
    a second attenuator with a second attenuation factor, the second attenuator coupled to the input node and configured to generate a third intermediate signal;
    a second amplifier with a second gain factor, the second amplifier configured to receive the third intermediate signal and to generate a fourth intermediate signal; and
    a summing circuit configured to generate an output signal using the second intermediate signal and the fourth intermediate signal, wherein the first amplifier, the feedback resistor, the first attenuator, the second attenuator, and the summing circuit are arranged such the output signal is substantially free of a noise component from the first amplifier.

2. The circuit of claim 1, wherein at least one of the first attenuator and the second attenuator is configured to use at least one of a capacitance and a resistor to adjust an attenuation factor.

3. The circuit of claim 1, wherein the first amplifier is an inverting amplifier and wherein the second amplifier is an inverting amplifier.

4. A circuit comprising:
a first amplifier with a first gain factor, the first amplifier coupled to an input node and configured to generate a first intermediate signal;
a feedback resistor to provide a feedback path for the first intermediate signal to be fed back to the input node;
a first attenuator with a first attenuation factor, the first attenuator configured to receive the first intermediate signal and to generate second intermediate signal;
a second attenuator with a second attenuation factor, the second attenuator coupled to the input node and configured to generate a third intermediate signal;
a second amplifier with a second gain factor, the second amplifier configured to receive the third intermediate signal and to generate a fourth intermediate signal; and
a summing circuit configured to generate an output signal using the second intermediate signal and the fourth intermediate signal, wherein at least one of the first attenuator and the second attenuator is configured to use at least a switch controlled by a logical signal to adjust an attenuation factor.

5. A circuit comprising:
a first amplifier with a first gain factor, the first amplifier coupled to an input node and configured to generate a first intermediate signal;
a feedback resistor to provide a feedback path for the first intermediate signal to be fed back to the input node;
a first attenuator with a first attenuation factor, the first attenuator configured to receive the first intermediate signal and to generate second intermediate signal;
a second attenuator with a second attenuation factor, the second attenuator coupled to the input node and configured to generate a third intermediate signal;
a second amplifier with a second gain factor, the second amplifier configured to receive the third intermediate signal and to generate a fourth intermediate signal; and
a summing circuit configured to generate an output signal using the second intermediate signal and the fourth intermediate signal, wherein the first attenuator includes an input impedance that is substantially higher than a source impedance associated with a source circuit coupled to the circuit via the input node.

6. The circuit of claim 5, wherein the first gain factor and the feedback resistor are configured to provide an impedance match to the source circuit.

7. The circuit of claim 5, wherein the feedback resistor and the first gain factor are configured to approximately satisfy the following relationship: $Rs=Ra/(1+A_1)$, where Rs denotes a value of the source impedance, Ra denotes a value of the feedback resistor, and $A_1$ denotes a value of the first gain factor.

8. The circuit of claim 5, wherein the second gain factor, the first attenuation factor, and the second attenuator are configured to approximately satisfy the following relationship $$\alpha_1 = Rs/(Rs+Ra) \cdot A_2 \cdot \alpha_2$$

where $\alpha_1$ denotes a value of the first attenuation factor, $\alpha_2$ denotes a value of the second attenuation factor, $A_2$ denotes a value of the second gain factor, Rs denotes a value of the source impedance, and Ra denotes a value of the feedback resistor.

9. The circuit of claim 5, wherein the feedback resistor, the second gain factor, the first attenuation factor, the second attenuator, and the summing circuit are configured to minimize noise contribution from the first amplifier to the output signal.

10. A method comprising:
amplifying an input signal by a first gain factor to generate a first intermediate signal;
forming a feedback path between the first intermediate signal and the input signal;
attenuating the first intermediate signal by a first attenuation factor to generate a second intermediate signal;
attenuating the input signal by a second attenuation factor to generate a third intermediate signal;
amplifying the third intermediate signal by a second gain factor to generate a fourth intermediate signal; and
combining the second intermediate signal and the fourth intermediate signal to generate an output signal, such that the first gain factor, the second gain factor, the first attenuation factor, and the second attenuation factor are selected to provide the output signal substantially free of a noise component from a first amplifier that generates the first intermediate signal.

11. The method of claim 10, wherein attenuating includes attenuating using at least one of a capacitor and a resistor.

12. The method of claim 10, wherein forming a feedback path includes forming a resistive coupling path between the first intermediate signal and the input signal.

13. The method of claim 10, wherein attenuating the first intermediate signal includes transmitting the first intermediate signal to a network including a plurality of capacitors.

14. The method of claim 10, wherein attenuating the input signal includes transmitting the input signal to a network including a plurality of capacitors.

15. The method of claim 10, wherein further comprising using a positive gain for the first gain factor and a positive gain for the second gain factor.

16. The method of claim 10, wherein further comprising configuring the feedback path, the first attenuation factor, the second attenuation factor, and the second gain factor so that a noise component in the second intermediate signal is approximately of the same magnitude as that of a noise component in the fourth intermediate signal but of an opposite phase.

17. A method comprising:
amplifying an input signal by a first gain factor to generate a first intermediate signal;
forming a feedback path between the first intermediate signal and the input signal;
attenuating the first intermediate signal by a first attenuation factor to generate a second intermediate signal;
attenuating the input signal by a second attenuation factor to generate a third intermediate signal;
amplifying the third intermediate signal by a second gain factor to generate a fourth intermediate signal; and
combining the second intermediate signal and the fourth intermediate signal to generate an output signal, wherein attenuating includes adjustably attenuating using at least a switch controlled by a logical signal.

18. A method comprising:
amplifying an input signal by a first gain factor to generate a first intermediate signal;
forming a feedback path between the first intermediate signal and the input signal;

attenuating the first intermediate signal by a first attenuation factor to generate a second intermediate signal;
attenuating the input signal by a second attenuation factor to generate a third intermediate signal;
amplifying the third intermediate signal by a second gain factor to generate a fourth intermediate signal; and
combining the second intermediate signal and the fourth intermediate signal to generate an output signal, further comprising establishing an input impedance to match a source impedance associated with a source circuit.

19. The method of claim 18, wherein establishing the input impedance includes adjusting at least one of a feedback resistance in the feedback path and the first gain factor.

20. The method of claim 18, further comprising establishing the input impedance so that the source impedance is approximately equal to a value of a feedback resistor in the feedback path divided by unity plus a value of the first gain factor.

* * * * *